(12) United States Patent
Wong et al.

(10) Patent No.: US 6,265,050 B1
(45) Date of Patent: Jul. 24, 2001

(54) ORGANIC OVERCOAT FOR ELECTRODE GRID

(75) Inventors: Kaiser H. Wong, Torrance; Tuan Anh Vo, Hawthorne, both of CA (US); Bing R. Hsieh, Webster, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/163,664

(22) Filed: Sep. 30, 1998

(51) Int. Cl.[7] ..................................... B32B 3/00
(52) U.S. Cl. ............... 428/209; 428/344; 428/355 R; 174/251; 174/258
(58) Field of Search ............................. 174/251, 258; 428/209, 344, 355 R

(56) References Cited

U.S. PATENT DOCUMENTS

| | | | |
|---|---|---|---|
| 2,573,143 | 10/1951 | Jacob | 178/5.2 |
| 2,577,894 | 12/1951 | Jacob | 346/75 |
| 3,152,858 | 10/1964 | Wadey | 346/75 |
| 3,572,591 | 3/1971 | Brown | 239/337 |
| 3,977,323 | 8/1976 | Pressman et al. | 101/426 |
| 3,997,113 | 12/1976 | Pennebaker, Jr. | 239/15 |
| 4,019,188 | 4/1977 | Hochberg et al. | 346/75 |
| 4,106,032 | 8/1978 | Miura et al. | 346/140 R |
| 4,113,598 | * 9/1978 | Jozwiak et al. | 428/426 |
| 4,171,777 | 10/1979 | Behr | 239/422 |

(List continued on next page.)

FOREIGN PATENT DOCUMENTS

| | | |
|---|---|---|
| 0 655 337 A2 | 5/1995 | (EP) . |
| 0 726 158 A1 | 8/1996 | (EP) . |
| 353035539A | 4/1978 | (JP) . |
| 53035539 A | 4/1978 | (JP) . |
| 55-019556 | 2/1980 | (JP) . |
| 55-028819 | 2/1980 | (JP) . |
| 56-146773 | 11/1981 | (JP) . |
| 58-224760 | 12/1983 | (JP) . |
| 60-229764 | 11/1985 | (JP) . |
| 362035847A | 2/1987 | (JP) . |
| 02 293151 | 12/1990 | (JP) . |
| 4-158044 | 6/1992 | (JP) . |
| 4-182138 | 6/1992 | (JP) . |
| 5-4348 | 1/1993 | (JP) . |
| 5-193140 | 8/1993 | (JP) . |
| 5-269995 | 10/1993 | (JP) . |

(List continued on next page.)

OTHER PUBLICATIONS

F. Anger, Jr. et al. Low Surface Energy Fluoro–Epoxy Coating for Drop–on–Demand Nozzles, *IBM Technical Disclosure Bulletin*, vol. 26, No. 1, p. 431, Jun. 1983.

N. A. Fuchs. The Mechanics of Aerosols, *Dover Publications, Inc.*, p. 79, 367–377, 1989 (Originally published in 1964 by Pergamon Press Ltd.) (no month).

Hue Le et al. Air–Assisted Ink Jet with Mesa–Shaped Ink–Drop–Forming Orifice, *Presented at the Fairmont Hotel in Chicago and San Jose*, Fall 1987, p. 223–227 (no month).

No author listed, Array Printers Demonstrates First Color Printer Engine, *The Hard Copy Observer Published by Lyra Research, Inc.*, vol. VIII, No. 4, p. 36, Apr. 1998.

Primary Examiner—Cathy Lam
(74) *Attorney, Agent, or Firm*—Jonathan A. Small; Linda M. Robb

(57) ABSTRACT

An organic, top-surface, semiconducting dielectric overcoat, having a selected time constant permits electric field charge and dissipation at a selected rate to facilitate particulate material movement over an underlying electrode grid. The coating may be made from a compound including bisphenol A polycarbonate, or similar material, and a charge transport molecule (e.g. m-TBD). A planarized, wear resistant, chemically stable surface, with minimized inter-electrode build-up are also provided by the overcoat.

13 Claims, 2 Drawing Sheets

U.S. PATENT DOCUMENTS

| | | | |
|---|---|---|---|
| 4,189,937 | 2/1980 | Nelson | 73/28 |
| 4,196,437 | 4/1980 | Hertz | 346/1.1 |
| 4,265,990 * | 5/1981 | Stolka et al. | 430/59 |
| 4,271,100 | 6/1981 | Trassy | 261/78 A |
| 4,284,418 | 8/1981 | Andres | 55/16 |
| 4,368,850 | 1/1983 | Szekely | 239/333 |
| 4,403,228 | 9/1983 | Miura et al. | 346/75 |
| 4,403,234 | 9/1983 | Miura et al. | 346/140 R |
| 4,480,259 | 10/1984 | Kruger et al. | 346/140 R |
| 4,490,728 | 12/1984 | Vaught et al. | 346/1.1 |
| 4,500,895 | 2/1985 | Buck et al. | 346/140 R |
| 4,514,742 | 4/1985 | Sugar et al. | 346/140 R |
| 4,515,105 | 5/1985 | Danta et al. | 118/629 |
| 4,523,202 | 6/1985 | Gamblin | 346/75 |
| 4,544,617 | 10/1985 | Mort et al. | 430/58 |
| 4,606,501 | 8/1986 | Bate et al. | 439/346 |
| 4,607,267 | 8/1986 | Yamamuro | 346/140 R |
| 4,613,875 | 9/1986 | Le et al. | 346/140 R |
| 4,614,953 | 9/1986 | Lapeyre | 346/140 R |
| 4,634,647 | 1/1987 | Jansen et al. | 430/84 |
| 4,647,179 | 3/1987 | Schmidlin | 355/3 DD |
| 4,663,258 | 5/1987 | Pai et al. | 430/57 |
| 4,666,806 | 5/1987 | Pai et al. | 430/57 |
| 4,683,481 | 7/1987 | Johnson | 346/140 R |
| 4,720,444 | 1/1988 | Chen | 430/58 |
| 4,728,969 | 3/1988 | Le et al. | 346/140 R |
| 4,741,930 | 5/1988 | Howard et al. | 427/265 |
| 4,760,005 | 7/1988 | Pai | 430/63 |
| 4,770,963 | 9/1988 | Pai et al. | 430/64 |
| 4,839,232 * | 6/1989 | Morita et al. | 428/209 |
| 4,839,666 | 6/1989 | Jayne | 346/75 |
| 4,870,430 | 9/1989 | Daggett et al. | 346/140 R |
| 4,882,245 | 11/1989 | Gelorme et al. | 430/14 |
| 4,896,174 | 1/1990 | Stearns | 346/459 |
| 4,929,968 | 5/1990 | Ishikawa | 346/140 R |
| 4,961,966 | 10/1990 | Stevens et al. | 427/299 |
| 4,973,379 | 11/1990 | Brock et al. | 156/640 |
| 4,982,200 | 1/1991 | Ramsay | 346/75 |
| 5,030,536 | 7/1991 | Pai et al. | 430/127 |
| 5,041,849 | 8/1991 | Quate et al. | 346/140 R |
| 5,045,870 | 9/1991 | Lamey et al. | 346/140 R |
| 5,063,655 | 11/1991 | Lamey et al. | 29/611 |
| 5,066,512 | 11/1991 | Goldowsky et al. | 427/14.1 |
| 5,113,198 | 5/1992 | Nishikawa et al. | 346/1.1 |
| 5,190,817 | 3/1993 | Terrell et al. | 428/343 |
| 5,202,704 | 4/1993 | Iwao | 346/140 R |
| 5,208,630 | 5/1993 | Goodbrand et al. | 355/201 |
| 5,209,998 | 5/1993 | Kavassalis et al. | 430/106 |
| 5,240,153 | 8/1993 | Tubaki et al. | 222/385 |
| 5,240,842 | 8/1993 | Mets | 435/172.3 |
| 5,294,946 | 3/1994 | Gandy et al. | 346/140 R |
| 5,300,339 | 4/1994 | Hays et al. | 428/36.9 |
| 5,350,616 | 9/1994 | Pan et al. | 428/131 |
| 5,363,131 | 11/1994 | Momose et al. | 347/46 |
| 5,385,803 | 1/1995 | Duff et al. | 430/138 |
| 5,403,617 | 4/1995 | Haaland | 427/180 |
| 5,425,802 | 6/1995 | Burton et al. | 95/32 |
| 5,426,458 | 6/1995 | Wenzel et al. | 347/45 |
| 5,428,381 | 6/1995 | Hadimioglu et al. | 347/46 |
| 5,482,587 | 1/1996 | McAleavey | 156/243 |
| 5,510,817 | 4/1996 | Sohn | 347/21 |
| 5,512,712 | 4/1996 | Iwata et al. | 174/258 |
| 5,520,715 | 5/1996 | Oeftering | 75/335 |
| 5,522,555 | 6/1996 | Poole | 241/33 |
| 5,535,494 | 7/1996 | Plesinger et al. | 29/25.35 |
| 5,541,625 | 7/1996 | Holstun et al. | 347/5 |
| 5,554,480 | 9/1996 | Patel et al. | 430/137 |
| 5,600,351 | 2/1997 | Hostun et al. | 347/40 |
| 5,604,519 | 2/1997 | Keefe et al. | 347/13 |
| 5,635,969 | 6/1997 | Allen | 347/96 |
| 5,640,187 | 6/1997 | Kashiwazaki et al. | 347/101 |
| 5,646,656 | 7/1997 | Leonhardt et al. | 347/43 |
| 5,654,744 | 8/1997 | Nicoloff, Jr. et al. | 347/43 |
| 5,678,133 | 10/1997 | Siegel | 399/67 |
| 5,682,190 | 10/1997 | Hirosawa et al. | 347/94 |
| 5,712,669 | 1/1998 | Swanson et al. | 347/49 |
| 5,717,986 | 2/1998 | Vo et al. | 399/291 |
| 5,731,048 | 3/1998 | Ashe et al. | 427/585 |
| 5,756,190 * | 5/1998 | Hosomi et al. | 428/209 |
| 5,761,783 | 6/1998 | Osawa et al. | 29/25.35 |
| 5,777,636 | 7/1998 | Naganuma et al. | 347/10 |
| 5,787,558 | 8/1998 | Murphy | 29/25.35 |
| 5,818,477 | 10/1998 | Fullmer et al. | 347/43 |
| 5,828,388 | 10/1998 | Cleary et al. | 347/21 |
| 5,853,906 | 12/1998 | Hsieh | 428/690 |
| 5,882,830 | 3/1999 | Visser et al. | 430/59 |
| 5,893,015 | 4/1999 | Mojarradi et al. | 399/291 |
| 5,900,898 | 5/1999 | Shimizu et al. | 347/93 |
| 5,958,122 | 9/1999 | Fukuda et al. | 106/31.57 |
| 5,967,044 | 10/1999 | Marschke | 101/363 |
| 5,968,674 | 10/1999 | Hsieh et al. | 428/690 |
| 5,969,733 | 10/1999 | Sheinman | 347/75 |
| 5,981,043 * | 11/1999 | Murakami et al. | 174/257 |
| 5,982,404 | 11/1999 | Iga et al. | 347/173 |
| 5,990,197 | 11/1999 | Escano et al. | 523/160 |
| 5,992,978 | 11/1999 | Fujii et al. | 347/54 |
| 6,019,466 | 2/2000 | Hermanson | 347/104 |
| 6,036,295 | 3/2000 | Ando et al. | 347/7 |
| 6,116,718 | 9/2000 | Peeters et al. | 347/21 |

FOREIGN PATENT DOCUMENTS

| | | |
|---|---|---|
| WO 93/11866 | 6/1993 | (WO) . |
| WO 94/18011 | 8/1994 | (WO) . |
| WO 97/01449 | 1/1997 | (WO) . |
| WO 97/27058 | 7/1997 | (WO) . |

* cited by examiner

ORGANIC OVERCOAT FOR ELECTRODE GRID

CROSS-REFERENCE TO RELATED APPLICATIONS

The present invention is related to U.S. patent application Ser. Nos. 09/163,893, 09/164,124, 09/163,308, 09/163,765, 09/163,839, 09/163,954, 09/163,924, 09/163,904, now U.S. Pat. No. 6,116,718, Ser. Nos. 09/163,799, 09/163,518, 09/164,104, 09/163,825, now U.S. Pat. No. 6,136,442, U.S. Pat. Nos. 5,717,986, 5,893,015, 5,968,674, and 5,853,906, and U.S. patent application Ser. No. 09/128,160, each of the above being incorporated herein by reference.

BACKGROUND

The present invention relates to the field of overcoat materials, and more specifically relates to overcoat materials functioning as relaxation coatings applied of electrode grids.

There are known or proposed systems for electrostatically agitating or moving fine particulate materials, such as marking material (e.g., toner) and the like. One such system is described in U.S. patent application Ser. No. 09/163,839, in which a grid of small and closely spaced electrodes are connected to a driver circuit such that a phased d.c. travelling electrostatic wave is established along the grid. Charged particulate material is transported by the electrostatic wave in a desired direction, at a desired velocity. Other such systems cause marking material particles to be agitated from a surface so as to be proximate a receiving surface such as a photoreceptor.

It is known to encapsulate electronic devices, such as integrated circuits, in protective coatings. Such coatings may provide physical protection from scratches, and a moisture barrier between the devices and the ambient environment. However, such materials are generally not used as top-surface dielectrics. Furthermore, such insulation and passivation layers typically have very high resistivities to avoid possible electrical shorts between covered leads.

We have discovered that there are a variety of criteria which overcoats for virtually all electrode grids of the type described above should address. First, it is desirable to provide a planarized surface over which the particulate material may reside or travel. Such a surface eliminates the problem of particulate material becoming trapped between the electrodes. Second, it is desirable to provide a material over the electrodes to provide rapid charge dissipation at a selected time constant. Third, arcing between electrodes must be prevented. Fourth, it is desirable that the overcoat provide a degree of wear resistance, especially in the case of marking material transport. Finally, it is important that such a layer be chemically stable. That is, the layer material must not react with the particulate material nor change characteristics in the presence of the operating environment. However, no known material to date has been able optimize each of these desired attributes.

SUMMARY

The present invention is a novel coating, for application over e.g. an electrode grid. The coating is an organic polymer layer, deposited over the metal electrodes of an electrode grid, protecting the metal electrodes from being affected by chemical, mechanical, and electrical environments. Arcing between electrodes is eliminated by the coating, which does not break down in the high voltage regime typically employed by particulate material moving grids (e.g., in the range of 400 volts or more). Forming the coating sufficiently thick to allow establishing a planar surface eliminates the accumulation of particulate material interstitially between electrodes.

The coating is a top-surface (that is, not sandwiched between layers) semiconducting dielectric, having a selected time constant to permit electric field charge and dissipation at a selected rate to permit particulate material agitation or movement over an underlying electrode grid.

In general, the coating is comprised of a polymeric binder (e.g., a polycarbonate such as MAKROLON 3108, a bisphenol A polycarbonate available from Bayer Polymers Division), a charge transport molecule (e.g., N,N'-bis(3-methylphenyl)-N,N'-diphenyl-(1,1'-biphenyl)-4,4"-diamine, also known as m-TBD), and solvents (e.g., methylene chloride, 1,1,2-trichloroethane) to dissolve the aforesaid chemicals. Alternatively, a chemical dopant (e.g., oxidant) may also be included to assist in the production of the conductive species in-situ.

According to one embodiment, the coating is a combination of Makrolon 3108, m-TBD, and the solvents methylene chloride and 1,1,2-trchloroethane. According to another embodiment, the coating is a combination of Makrolon 3108, m-TBD, the solvents methylene chloride and 1,1,2-trichloroethane, and (di-tert-butylphenyl)iodonium hexafluoroarsenate. Still another embodiment, the coating is a combination of MAKROLON 3108 a bisphenol A polycarbonate m-TBD, the solvents methylene chloride and 1,1,2-trichloroethane, and a cation salt of TM-TBD together with trifluoroacetate. One method of application is use of a low pressure, high volume spray gun to spray coat to a desired thickness, for example about 37 $\mu$m ±2 $\mu$m. The thickness is a function of the electrode thickness, and should be sufficient to provide a planar surface.

However, since one application of the present invention may be a coating overlying a flexible substrate, an excessively thick (e.g., 50 $\mu$m) coating may crack when the electrode substrate is bent to conform to a particular shape. Thus, the thinner the electrode, the thinner the required coating, and the easier the polishing procedure. And, the thinner the electrode, the easier it is to achieve planarization.

Following drying, the spray coated electrode grid is polished to produce a smooth, planar surface. One of many known polishing techniques is employed, such as polishing with successively finer abrasives.

The time constant of the coating, as determined by the product of the dielectric constant and the resistivity of the material, is preferably between 1–200 microseconds (ms). Within this range of time constant, particulate material may be either agitated to a desired height or moved from electrode to electrode, across a grid of electrodes at a speed about 1 to 2 meters per second (m/s). However, in the case of a particle moving grid, the larger the time constant, the slower the speed of movement of the particulate material across the electrode grid. The bulk resistivity of the coating is preferably between $1 \times 10^9$ and $1 \times 10^{12}$ ohm·centimeters ($\Omega$·cm). The dielectric constant of the coating should be in the range of 4 to 12.

Thus, the present invention and its various embodiments provide numerous advantages discussed above, as well as additional advantages which will be described in further detail below.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described, such as pressures, temperatures, thicknesses, voltage, frequency, etc. These recited ranges are to be treated as examples only, and are not intended to limit the scope of the claims hereof. In addition, a number of materials are identified as suitable for various facets of the embodiments, such as for marking materials, layer materials, etc. These recited materials are also to be treated as exemplary, and are not intended to limit the scope of the claims hereof.

Figure 1:
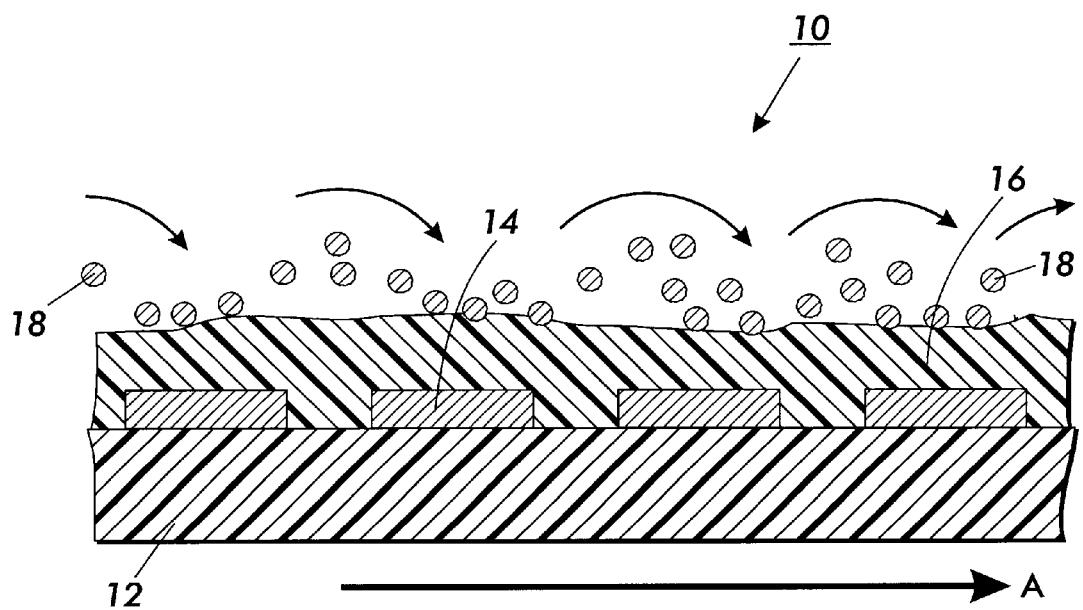
FIG. 1 is a cross-sectional illustration of a grid-type particulate particle mover having an overcoat thereon according to the present invention.
Figure 2:
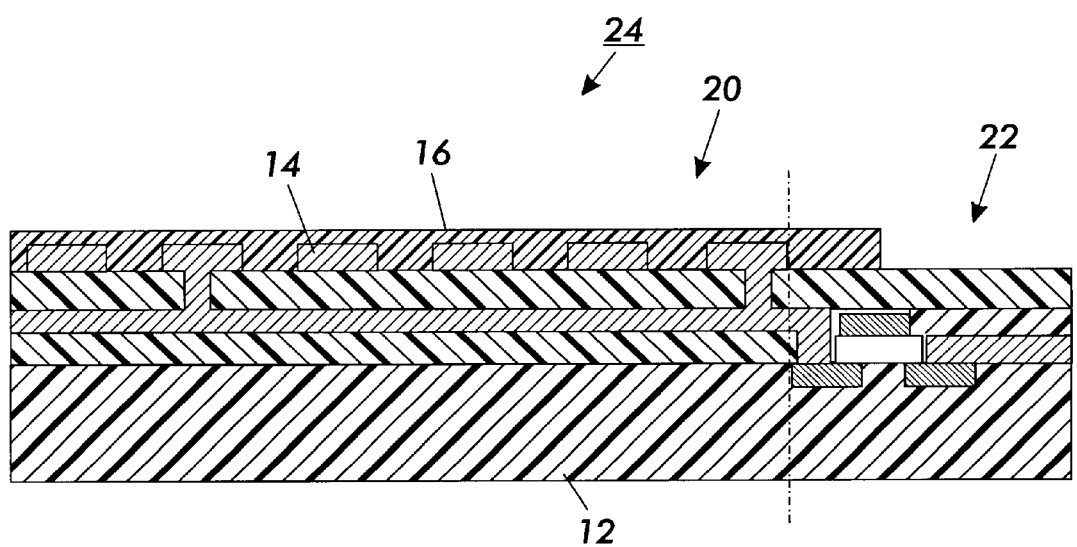
FIG. 2 is a cross-sectional illustration of a hybrid device, including both an electrode which is part of a particulate transport electrode grid, and a thin film transistor which may be used for driver, clock, logic or other circuitry.

With reference now to FIG. 1, there is shown therein in cross-section one embodiment 10 of a grid of electrodes 14 formed on a substrate 12. Embodiment 10 is an example of a marking material particle mover, but it should be recognized that the function of the underlying grid does not limit the scope of the present invention. The present invention is applicable over grids serving other functions (not shown) such as particle agitation, etc.

Overlying the grid of electrodes 14 is an organic overcoat 16 according to the present invention. Other layers (not shown) may form a part of an embodiment of the type shown in FIG. 1, such as interface layers, electrical interconnection layers, etc. In addition, the geometry of an embodiment may vary from that shown in FIG. 1 (although not shown herein). For example electrodes may be formed to have a different profile and thickness, and may be formed in differing locations on the substrate. In any case, a traveling electrostatic wave produced by means not shown herein causes particulate material 18 to travel from electrode to electrode in the direction of arrow A.

Electrodes 14 are typically constructed of copper, for example 10–25 microns thick, although they may be formed of other materials. A common process for the formation of electrodes 14 is by wet chemical etching of a photolithographically defined copper electrode pattern on Kapton (polyimide film), a common practice in the art of flexible circuit. Two important criteria for the overcoat of the present invention are that (1) the process used to form it not negatively affect the electrodes or substrate, and (2) that the material from which it is formed not negatively interact with the electrodes or the substrate.

EXAMPLE 1

According to one embodiment of the present invention, a coating solution consisting of a polymer such as 18.8 grams (about 3.1 wt. %) of MAKROLON 3108 (bisphenol A polycarbonate), a charge transport agent such as 10.2 grams of m-TBD (1.7 wt. %) in 340 grams (about 56.8 wt. %) of methylene chloride and 230 grams (about 38.4 wt. %) of 1,1,2-trichloroethane is prepared. In general, the polymer for such a solution may be selected from the group comprising a polycarbonate (e.g., MAKROLON 3108, 3208, 5705, or PCZ 200, 400), a polyvinylcarbazole, or cellulose acetate butyrate. Also the charge transport agent for such a solution may be selected from the group comprising m-TBD, p-TBD, TM-TBD, and dihydroxy m-TBD. In addition to or in place of methylene chloride and 1,1,2-trichloroethane, a number of other solvents may be employed.

A particle mover electrode grid (for example 25 μm thick copper electrodes with 75 μm electrode width and spacing on a 50 μm thick polyimide film) is cleaned by submicron aluminum oxide slurry, then neutralized with very diluted hydrochloric acid (about 0.1%, or equivalent acidic solution) and to remove any oxidized layer on the metal electrodes. A de-ionized water rinse is the next step. As an indication that no contamination is left on the electrode grid, the grid should be wettable by the DI water rinse. The uncoated electrode grid is air-blow dried and then dried in an oven at 40° C. for 10 to 15 minutes.

Using a low pressure, high volume spray gun, the electrode grid is spray coated with the coating solution under a fume hood to obtain a coating thickness of about 37 μm±2 μm. The coated electrode grid is next air-dried under a fume hood for 10 to 15 minutes, then placed in an oven at 40° C. for 2 hours. The grid is then placed in a vacuum oven operating at about 4.5 Torr, purging with nitrogen. The grid is baked inside the vacuum oven through a drying cycle of 2 hrs at 40° C., one hour at 50° C. and 2 hours at 65° C. The purpose of the series of drying steps is to minimize rapid outgassing of solvents from the coating, to in turn minimize any bubble formation in the dried coating layer.

After drying, the organic coating layer is polished using successively finer diamond polishing compounds. For example, a starting compound may have a particle size of 6 μm particles, then a compound of 3 μm particles, then 1 μm particles to produce a smooth surface. With sufficient initial thickness of the overcoat layer, a planar surface is also thereby obtained.

The time constant of the organic film should range from about 50 ms to about 200 ms to enable meaningful toner movement at optimal operating conditions, e.g. at 500 volt and 1.2 KHz frequency. Within a desired range of time constants, the velocity of toner movement is also a function of operating voltage and frequency. As a rule of thumb, the higher the voltage and frequency, the faster the velocity of toner movement. Resistivity and dielectric constant of this film determine the time constant. A target resistivity of between $1 \times 10^{10}$ and $1 \times 10^{12}$ ohms·cm, and dielectric constant of between 4 and 12 are obtainable from the above-described overcoat, and may produce time constants which produce a meaningful velocity of toner movement (1 to 2 m/s) well within the required range.

The desired resistivity of the organic overcoat may be obtained by controlling the concentration (wt. %) of the m-TBD in the final coating composition.

The ultimate thickness of the overcoat layer will depend on the electrode metal thickness. For 25 μm thick metal electrodes, an overcoat layer thickness on the order of 35 to 40 μm before polishing will suffice. During the planarization and polishing process approximately 5 μm of the coating would be polished off.

Thus, the organic overcoat may be tailored to have a resistivity on the order of between $1 \times 10^{10}$ and $1 \times 10^{12}$ Ω-cm, and preferably between $1 \times 10^{10}$ Ω-cm and $1 \times 10^{11}$ Ω-cm, or even between $1 \times 10^{10}$ Ω-cm and $5 \times 10^{10}$ Ω-cm. This is significantly lower than the resistivity of a typical insulation or passivation layer, which would be on the order of $10^{14}$ to $10^{16}$ Ω-m. The time constant (τ) for the overcoat is related to the resistivity (ρ) and the dielectric constant (ε), as:

$$\tau = \rho \cdot \epsilon$$

A desired time constant for the proper establishment then dissipation of an electric field for particulate transport at a reasonable speed (1 to 2 m/s) is in the range of 50–100 ms. However, time constants up to, for example 1 second, are contemplated hereby, with the consequent reduction in particulate material transport speed. Indeed, a desired transport speed may be obtained by properly selecting the time constant of the layer (i.e., adjusting the resistivity) and selecting the optimal operating conditions such as voltage and frequency.

EXAMPLE 2

According to another embodiment of the present invention, a coating solution further includes an oxidant. The solution consists of MAKROLON 3108, a bisphenol A polycarbonate (3.14 wt. %), m-TBD (1.70 wt. %), cation salts of TM-TBD (0.78 wt. % with respect to m-TBD), silver trifluoroacetate (0.83 wt. % to m-TBD), methylene chloride (56.7 wt. %), and 1,1,2-trichloroethane (38.4 wt. %). It should be noted, however, that the cation salts may range from 0.25 wt. % to 2.5 wt. % with respect to m-TBD, and silver trifluoroacetate may range from 0.25 wt. % to 2.6 wt. % with respect to m-TBD, while the other components remain as stated. The preparation and application process is essentially as described above in Example 1.

The time constant of the organic film of this example will range from about 1 ms to about 100 ms, thus enabling meaningful toner movement at optimal operating conditions, e.g. at 500 volt and 1.2 KHz frequency. A target resistivity of between $1 \times 10^9$ and $1 \times 10^{11}$ ohms·cm, and dielectric constant of between 4 and 12 are obtainable from the above-described overcoat, and may produce time constants which produce meaningful velocity of toner movement (1 to 2 m/s) well within the required range. The ultimate thickness of the overcoat layer will again depend on the electrode metal thickness. For 25 μm thick metal electrodes, an overcoat layer thickness on the order of 35 to 40 μm before polishing will suffice.

In the present embodiment, the desired resistivity may be obtained by controlling either one or both of the concentrations (wt. %) of the oxidant or m-TBD in the final coating composition. The organic overcoat may be tailored to have a resistivity on the order of between $1 \times 10^9$ and $1 \times 10^{11}$ Ω-cm, and preferably between $1 \times 10^9$ Ω-cm and $1 \times 10^{10}$ Ω-cm, or even between $1 \times 10^9$ Ω-cm and $5 \times 10^9$ Ω-cm. Table 1 is an illustration of the variation of time constant as a function of the coating oxidant content.

TABLE 1

| Cation salts of TM-TBD (wt. % with respect to m-TBD) | Silver trifluoroacetate (wt. % with respect to m-TBD) | Time Constant (ms) |
| --- | --- | --- |
| 0.25 | 0.25 | 20 |
| 0.5 | 0.5 | 15 |
| 0.78 | 0.84 | 1.6 |
| 2.5 | 2.6 | 2 |

EXAMPLE 3

In yet another example, the solution is comprised of MAKROLON 3108, bisphenol A polycarbonate (2.90 wt. %), m-TBD (1.94 wt. %), (di-tert-butylphenyl)iodonium hexafluoroarsenate (0.235 wt. % with respect to m-TBD), methylene chloride (56.8 wt. %), and 1,1,2-trichloroethane (38.4 wt. %). However, the oxidant (di-tert-butylphenyl) iodonium hexafluoroarsenate may vary from 0.2 wt. % to 2.0 wt. % with respect to m-TBD, while the remaining components would have the proportions indicated. The preparation and application process is essentially as described above in Example 2, with the exception that 2 minutes of exposure to UV radiation is required to obtain semiconductive properties of the layer. The resulting characteristics of the coating are substantially as stated in Example 2 above.

It has been observed, however, that the coating of this example appears to be a dynamic chemical system. Reactions altering the system characteristics may be initiated in-situ, producing polymer chain fragmentation which could be responsible for cracking and crazing. These changes may also directly impact the electrical properties of the system. Experimental results from a stress-aged film (samples being placed in a humidity chamber at 50° C. and 80–100% relative humidity for 24 days) showed losses in molecular weight and emergence of new peaks in the oligomeric region containing both charge transport molecule cation radicals and polymer fragments. This signals that chemical changes occurred in the system. However, the lifespan of a system according to this example is not precisely known.

While the present invention has been discussed in terms of embodiments focussing on the combination of bisphenol A polycarbonate, m-TBD, methylene chloride, and 1,1,2-trichloroethane, It will be apparent to one skilled in the art that various embodiments of an organic coating for a particulate marking material transport device are contemplated herein. Furthermore, while embodiments described and alluded to herein are capable of providing an adequate overcoat for devices including electrode grids, such as particulate marking material movers, the present invention is not limited to marking material or particle movement, but may find applicability in a variety of other environments requiring an overcoat. Thus, it should be appreciated that the description herein is merely illustrative, and should not be read to limit the scope of the invention nor the claims hereof.

What is claimed is:

1. A combination of electrode grid and organic top-surface coating overlying said electrode grid, comprising:
   a substrate;
   a plurality of electrodes formed on said substrate; and
   an organic top-surface coating overlaying said electrodes and said substrates comprising:
     a polymer selected from the group consisting of polycarbonate, polyvinylcarbazole, or cellulose acetate butyrate;
     a charge transport agent selected from the group consisting of m-TBD, P-TBD, TM-TBD, or dihydroxy m-TBD; and
     a solvent, wherein said solvent is a solution comprising methylene chloride and 1,1,2-trichloroethane;
     wherein said coating has a time constant, a dielectric constant, and a resistivity, said time constant, determined by a product of the dielectric constant and the resistivity of the material, being between 1 microsecond and 1 second, said dielectric constant being between 4 and 12, and said resistivity being between $1 \times 10^{10}$ and $1 \times 10^{11}$ ohm-centimeters.

2. The combination of claim 1, wherein said time constant is between 50 and 200 microseconds.

3. The combination of claim 1, wherein said time constant is between 1 and 100 microseconds.

4. The combination of claim 3, wherein said dielectric constant is between 4 and 12, and further wherein said resistivity is between $1\times10^9$ and $1\times10^{11}$ ohm-centimeters.

5. The combination of claim 1, further comprising an oxidant selected from the group consisting of (di-tert-butylphenyl)iodonium hexafluoroarsenate and cation salts of TM-TBD together with silver trifluoroacetate.

6. A combination of an electrode grid and an organic coating overlying said electrode grid, comprising:
   a substrate;
   a plurality of electrodes formed on said substrate; and
   a layer of material overlying said electrodes and said substrate, said layer comprising bisphenol A polycarbonate, a charge transport agent, and a solvent, wherein said solvent is a solution comprising methylene chloride and 1,1,2-trichloroethane, said layer having a bulk resistivity between $1\times10^{10}$ and b $1\times10^{12}$ ohm·centimeters, a dielectric constant between 4 and 12, and a time constant, as determined by a product of a dielectric constant of the material and the bulk resistivity of the material, between 50 and 200 microseconds, said layer being between 35 $\mu$m and 40 $\mu$m thick.

7. A method of forming a combination of an electrode grid and an organic coating applied over said electrode grid, comprising the steps of:
   providing a substrate having a plurality of electrodes located thereon;
   preparing a solution comprising:
      a polymer selected from the group consisting of polycarbonate, polyvinylcarbazole, or cellulose acetate butyrate;
      a charge transport agent selected from the group consisting of m-TBD, p-TBD, TM-TBD, or dihydroxy m-TBD; and
      a solvent, wherein said solvent is a solution comprising methylene chloride and 1,1,2-trichloroethane;
   spray coating said solution onto said substrate so as to substantially cover said electrodes and form a coating; and
   drying said coating, first at ambient pressure and second in a vacuum chamber, such that formation of bubbles in the coating due to outgassing is minimized.

8. The method of claim 7, further comprising the step of polishing one surface of the coating following drying to obtain a smooth and planar coating surface.

9. The method of claim 7, wherein said coating following drying has a time constant between 50 and 200 microseconds.

10. The method of claim 9, wherein said coating following drying has a dielectric constant between 4 and 12, and further wherein said coating has a resistivity between $1\times10^{10}$ and $1\times10^{11}$ ohm-centimeters.

11. The method of claim 7, wherein said coating following drying has a time constant between 1 and 100 microseconds.

12. The method of claim 11, wherein said coating following drying has a dielectric constant between 4 and 12, and further wherein said coating has a resistivity between $1\times10^9$ and $1\times10^{11}$ ohm-centimeters.

13. The method of claim 7, wherein said solution further includes an oxidant selected from the group consisting of (di-tert-butylphenyl)iodonium hexafluoroarsenate or a cation salt of TM-TBD together with silver trifluoroacetate.

* * * * *